(12) United States Patent
Borkar et al.

(10) Patent No.: US 7,733,177 B1
(45) Date of Patent: Jun. 8, 2010

(54) METHOD AND SYSTEM FOR CALCULATING THE PRE-INVERSE OF A NONLINEAR SYSTEM

(75) Inventors: Milind Anil Borkar, Dallas, TX (US); Fernando Alberto Mujica, Allen, TX (US); Gregory Copeland, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 12/333,061

(22) Filed: Dec. 11, 2008

(51) Int. Cl.
*H03F 1/26* (2006.01)
(52) U.S. Cl. .................................. 330/149; 375/297
(58) Field of Classification Search .................. 330/149
See application file for complete search history.

(56) References Cited

U.S. PATENT DOCUMENTS

| | | | |
|---|---|---|---|
| 6,714,073 B2 * | 3/2004 | Suto et al. .................... | 330/149 |
| 6,731,168 B2 * | 5/2004 | Hedberg et al. ............. | 330/149 |
| 6,882,221 B2 * | 4/2005 | Schreyer et al. ............. | 330/149 |
| 7,068,980 B2 | 6/2006 | Seo et al. | |
| 7,321,264 B2 * | 1/2008 | Kokkeler .................... | 330/149 |
| 7,333,559 B2 | 2/2008 | Song et al. | |

OTHER PUBLICATIONS

"A Reconsideration of the PTH-Order Invere Predistorter," 1999 IEEE 49th Vehicular Technology Conference, vol. 2, pp. 1501-1504 (Chi-Hao Cheng and Edward J. Powers).

"Nonlinear Filters: Beyond the Kalman Filter," IEEE A& E Magazine, vol. 20, No. 8, Aug. 2005, pp. 58-69 (Fred Daum).

"A Robust Digital Baseband Predistorter Constructed Using Memory Polynomials," IEEE Transactions on Communications, vol. 52, No. 1, Jan. 2004, pp. 159-165 (Lei Ding, G. Tong Zhou, Dennis R. Morgan, Zhengxiang Ma, J. Stevenson Kenney, Jaehyeong Kim and Charles R. Giardina).

"Behavioral Modeling of RF Power Amplifiers Using Adaptive Recursive Polynomial Functions," Proceedings of the IEEE International Microwave Theory and Techniques Symposium, Jun. 2006, pp. 852-855 (John Dooley, Bill O'Brien and Thomas Brazil).

"Modeling Distortion in Mutichannel Communication Systems," IEEE Transactions on Microwave Theory and Techniques, vol. 53, No. 5, May 2005, pp. 1682-1692 (Khaled M. Gharaibeh and Michael B. Steer).

(Continued)

*Primary Examiner*—Henry K Choe
(74) *Attorney, Agent, or Firm*—John J. Patti; Wade J. Brady, III; Frederick J. Telecky, Jr.

(57) ABSTRACT

An apparatus is provided to determine pre-distortion for a nonlinear system. The apparatus comprises a datapath and a power amplifier. The datapath employs predistortion data to generally linearized the power amplifier. To generate this predistortion data, an indirect learning circuit and a direct learning circuit can be employed. The indirect learning circuit is generally coupled to the amplifier circuit so that it can iteratively adjust predistortion data during an indirect learning mode until convergence is reached. The direct learning circuit is generally coupled to the amplifier circuit and the indirect learning circuit and that receives the input signal so that the predistortion data can be copied to the direct learning circuit from the indirect learning after convergence is reached and so that the direct learning circuit can adjust the predistortion data during a direct learning mode.

10 Claims, 1 Drawing Sheet

OTHER PUBLICATIONS

"On the Wiener and Hammerstein Models for Power Amplifier Predistortion," Proc. Asia-Pacific Microwave Conference (APMC'05), pp. 1-4 (P.L. Gilabert, G. Montoro and E. Bertran).

"A Comparative Analysis of Behavioral Models for RF Power Amplifiers," IEEE Transactions on Microwave Theory and Techniques, vol. 54, No. 1, Jan. 2006, pp. 348-359 (Magnus Isaksson. David Wisell and Daniel Rönnow).

"Analysis and Compensation of Nonlinear Power Amplifier Effects in Multi-Antenna OFDM Systems," Dissertation 2007, pp. 1-133 (Fernando H. Gregorio).

"Adaptive Polynomial Filters," IEEE Signal Processing Magazine, vol. 8, Jul. 2001, pp. 10-26 (John Mathews).

"The Matrix Cookbook," Sep. 2007, pp. 1-63 (Kaare Brandt Petersen and Michael Syskind Pedersen).

"A Generalized Memory Polynomial Model for Digital Predistortion of RF Power Amplifiers," IEEE Transactions on Signal Processing, vol. 54, No. 10, Oct. 2006, pp. 3852-3860 (Dennis R. Morgan, Zhengxiang Ma,, Jaehyeong Kim, Michael G. Zierdt and John Pastalan).

"Advanced Countermeasures for Interference, Distortion, and Fading in Satellite Communications," Dissertation, Mar. 2006, pp. 1-132 (Massimo Neri).

"Estimation of Memory Length for RF Power Amplifier Behavioral Models," Proceedings of the 36th European Microwave Conference, Sep. 2006, Manchester, UK, pp. 680-682 (Bill O'Brien, John Dooley, Anding Zhu, and Thomas J. Brazil).

"Orthogonal Polynomials for Power Amplifier Modeling and Predistorter Design," IEEE Transactions on Vehicular Technology, vol. 53, No. 5, Sep. 2004, pp. 1468-1479 (Raviv Raich, Hua Qian, and G. Tong Zhou).

"Orthogonal Polynomials for Complex Gaussian Processes," IEEE Transactions on Signal Processing, vol. 52, No. 10, Oct. 2004, pp. 2788-2797 (Raviv Raich and G. Tong Zhou).

"Theory of pth-Order Inverses of Nonlinear Systems," IEEE Transactions on Circuits and Systems, vol. Cas-23, No. 5, May 1976, pp. 285-291 (Martin Schetzen).

"Closed-Loop Digital Pre-Distortion for Power Amplifier Linearization using Genetic Algorithms," IEEE Radio and Wireless Conference, RAWCON 2004, Sep. 2004, pp. 347-350 (R.Sperlich, J.A. Sills and J. Stevenson Kenney).

"Power Amplifier Linearization with Digital Pre-Distortion and Crest Factor Reduction," International Microwave Symposium, Jun. 2004, pp. 669-672 (Roland Sperlich, Youngcheol Park, Greg Copeland* and J. Stevenson Kenney).

"Principles of Fractional Delay Fibers," Porceedings of the IEEE International Conference on Acoustics, Speech and Signal Processing, Istanbul, Turkey, Jun. 2000, pp. 1-4 (V. Valimaki and T. I. Laakso).

"On the Baseband Representation of a Bandpass Nonlinearity," IEEE Transactions on Signal Processing, vol. 53, No. 8, Aug. 2005, pp. 2953-2957 (G. Tong Zhou, Hua Qian, Lei Ding, and Raviv Raich).

"An Efficient Volterra-Based Behavioral Model for Wideband RF Power Amplifiers," IEEE MTT-S Dig., vol. 2, 2003, pp. 787-790 (Anding Zhu, Michael Wren and Thomas J. Brazil).

"Behavioral Modeling of RF Power Amplifiers Based on Pruned Volterra Series," IEEE Microwave and Wireless Components Letters, vol. 14, No. 12, Dec. 2004, pp. 563-565 (Anding Zhu and Thomas J. Brazil).

"Optimal Digital Volterra Predistorter for Broadband RF Power Amplifier Linearization," 31st European Microwave Conference, Oct. 2001, pp. 1-4 (Anding Zhu and Thomas J. Brazil).

* cited by examiner

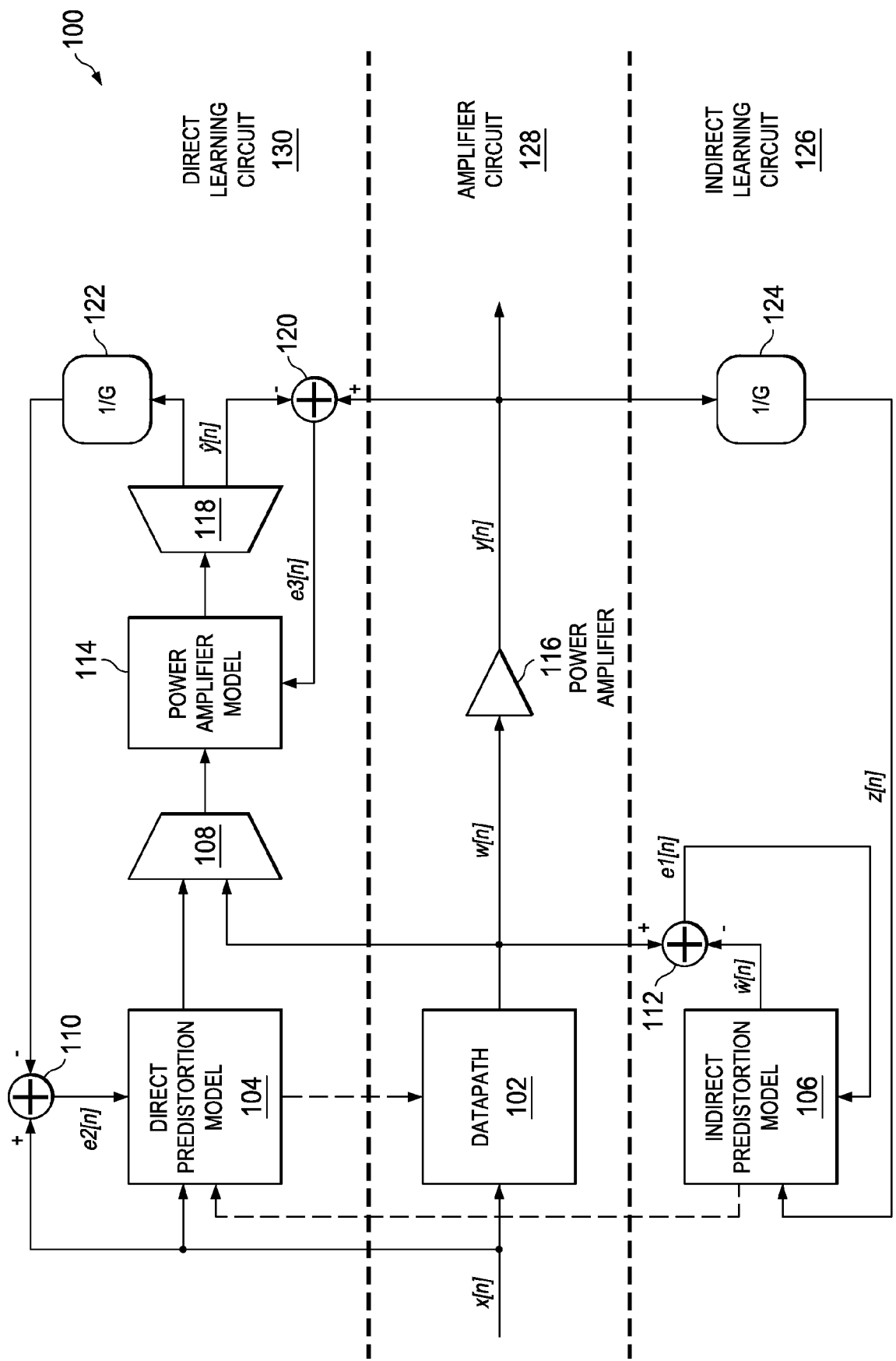

METHOD AND SYSTEM FOR CALCULATING THE PRE-INVERSE OF A NONLINEAR SYSTEM

TECHNICAL FIELD

The invention relates generally to nonlinear system and, more particularly, to estimating pre-inverses for a nonlinear system.

BACKGROUND

There are many nonlinear devices in use today. An example is a power amplifier. Oftentimes, to counteract the nonlinearities in these devices, pre-inverses are used to effectively cause the nonlinear device and system to operate linearly. Some examples of systems used to estimate pre-inverses are: U.S. Pat. No. 7,068,980; U.S. Pat. No. 7,333,559; Cheng et al., "A Reconsideration of the $P^{th}$-Order Inverse Predistorter," IEEE 49th Vehicular Technology Conference, Vol. 2, pp. 1501-1504, 1999; Daum, F., "Nonlinear Filters: Beyond the Kalman Filter," IEEE A&E Magazine, Vol. 20, No. 8, pp. 58-69, August 2005; Ding et al., "A Robust Digital Baseband Predistorter Constructed Using Memory Polynomials," IEEE Trans. on Communications, Vol. 52, No. 1, pp. 159-165, January 2004; Dooley et al., "Behavioral modeling of RF power amplifiers using adaptive recursive polynomial functions", Proceedings of the IEEE International Microwave Theory and Techniques Symposium, IMS 2006, WE4A-2, San Francisco, June 2006; Gharaibeh et al., "Modeling Distortion in Multichannel Communication Systems," IEEE Trans. on Microwave Theory and Techniques, Vol. 53, No. 5, pp. 1682-92, May 2005; Gilabert et al., "On the Wiener and Hammerstein Models for Power Amplifier Predistortion," Proc. Asia-Pacific Microwave Conference (APMC'05). Suzhou, Xina: IEEE, 2005, vol. 2, p. 1191-119; M. Isaksson, D. et al., "A Comparative Analysis of Behavioral Models for RF Power Amplifiers," IEEE Trans. on Microwave Theory and Techniques, vol. 54, pp. 348-59, 2006; Gregorio, F. H., "Analysis and Compensation of Nonlinear Power Amplifier Effects in Multi Antenna OFDM Systems," Dissertation, 2007; Mathews, V. J. "Adaptive Polynomial Filters," IEEE Signal Processing Mag., vol. 8. pp. 1-26, July 1991; K. Petersen and M. Pedersen, "The Matrix Cookbook," September, 2007; Morgan et al., "A Generalized Memory Polynomial Model for Digital Predistortion of RF Power Amplifiers," IEEE Trans. Signal Process, vol. 54, no. 10, pp. 3852-3860, October 2006; Neri, M., "Advanced Countermeasures for Interference, Distortion, and Fading in Satellite Communications," Dissertation, March 2006; O'Brien et al., "Estimation of Memory Length for RF Power Amplifier Behavioral Models," Proc. IEEE European Microwave Conference (EuMC'06), pp. 680-682, September 2006; Raich et al., "Orthogonal Polynomials for Power Amplifier Modeling and Predistorter Design," IEEE Trans. Vehicular Technology, vol. 53, no. 5, pp. 1468-1479, September 2004; Raich et al., "Orthogonal Polynomials for Complex Gaussian Processes," IEEE Trans. Signal Processing, VOL. 52, NO. 10, October 2004; Schetzen, M., "Theory of $P^{th}$-Order Inverses of Nonlinear Systems," IEEE Trans. on Circuits and Systems, Vol. 23, No. 5, pp. 285-291, May 1976; Sperlich et al., "Power Amplifier Linearization with Memory Effects Using Digital Pre-distortion and Genetic Algorithms," IEEE Radio and Wireless Conference, RAWCON 2004, September 2004; Sperlich et al., "Power Amplifier Linearization with Digital Pre-Distortion and Crest Factor Reduction", International Microwave Symposium, IMS 2004, June 2004; Valimaki et al., "Principles of Fractional Delay Filters," Proceedings of the IEEE International Conference on Acoustics, Speech and Signal Processing, Istanbul, Turkey, pp. 3870-3873, 5-9 Jun. 2000; Zhou et al., "On the Baseband Representation of a Bandpass Nonlinearity," IEEE Trans. Signal Process, vol. 53, no. 8, pp. 2953-2957, August 2005; Zhu et al., "An Efficient Volterra-based Behavioral Model for Wideband RF Power Amplifiers," in IEEE MTT-S Dig., vol. 2, 2003, pp. 787-790; Zhu et al., "Behavioral Modeling of RF Power Amplifiers Based on Pruned Volterra Series," IEEE Microwave Wireless Compon. Lett., vol. 14, pp. 563, December 2004; and Zhu et al., "Optimal Digital Volterra Predistorter for Broadband RF Power Amplifier Linearization," $31^{st}$ European Microwave Conference, pp 1-4, October 2001.

SUMMARY

An embodiment of the invention, accordingly, provides an apparatus. The apparatus comprises an amplifier circuit including: a datapath that receives an input signal; and a power amplifier that is coupled to the datapath, wherein the power amplifier receives a first output from the datapath, and wherein the power amplifier provides a second output; an indirect learning circuit that is coupled to the amplifier circuit, wherein the indirect learning circuit iteratively adjusts predistortion data based at least in part on the first output and the second output during an indirect learning mode until convergence is reached; and a direct learning circuit that is coupled to the amplifier circuit and the indirect learning circuit and that receives the input signal, wherein the predistortion data is copied to the direct learning circuit from the indirect learning circuit after convergence is reached, wherein the direct learning circuit adjusts the predistortion data during a direct learning mode, and wherein the direct learning circuit adjusts the operation of the datapath with the predistortion data.

In accordance with another embodiment of the invention, the indirect learning circuit further comprises a gain circuit that is coupled to the power amplifier and that receives the second output; an indirect predistortion model that is coupled to the gain circuit; and a summing circuit that is coupled to the datapath and the indirect predistortion model, wherein the summing circuit combines at least a portion of the first output with an output from the indirect predistortion model, and wherein the summing circuit feeds back its output to the indirect predistortion model to adjust the predistortion data during the indirect learning mode.

In accordance with another embodiment of the invention, the indirect predistortion model further comprises processing circuitry with computer programming code for the indirect predistortion model embodied thereon.

In accordance with another embodiment of the invention, the direct learning circuit further comprises: a direct predistortion model that is adapted to receive predistortion data from the indirect learning circuit and that receives the input signal, wherein the direct predistortion model is adapted to adjust the datapath; a power amplifier model that is adapted to receive a third output from the direct predistortion model; a gain circuit that is adapted to receive a fourth output from the power amplifier model; and a summing circuit that is coupled to the gain circuit and the direct predistortion model and that receives the input signal, wherein the summing circuit combines at least a portion of the input signal with at least a portion of a fifth output from the gain circuit, and wherein the summing circuit provides a sixth output to the direct predistortion model.

In accordance with another embodiment of the invention, the direct predistortion model further comprises processing circuitry with computer programming code for the direct predistortion model embodied thereon.

In accordance with another embodiment of the invention, the direct learning circuit further comprises a second summing circuit that receives an output from the power amplifier and that is adapted to receive the fourth output; a multiplexer that is coupled between the direct predistortion model and the power amplifier model, wherein the multiplexer is adapted to receive the first output and the third output; and a demultiplexer that is coupled between the power amplifier model and the gain circuit, and wherein the demultiplexer is coupled between the power amplifier model and the second summing circuit.

In accordance with another embodiment of the invention, a method for determining a pre-inverse of a nonlinear system. The method comprises indirectly adjusting predistortion data during an indirect learning mode until convergence is reached by iteratively: providing an input signal to a datapath; providing an output from the datapath to a power amplifier and to an indirect learning circuit; and adjusting the predistortion data based at least in part on the output from the datapath and at least in part based on an output from the power amplifier; copying the predistortion data from the indirect learning circuit to a direct learning circuit; and directly adjusting the predistortion data during a direct learning mode after convergence has been reached by iteratively adjusting the predisortion data based at least in part on an output of a power amplifier model.

In accordance with another embodiment of the invention, the step of adjusting the predistortion data based at least in part on the output from the datapath and at least in part based on the output from the power amplifier further comprises receiving the output from the power amplifier by a gain circuit; providing an output from the gain circuit to an indirect predistortion model; generating an adjustment for the predistortion data at least in part from the output from the datapath and at least in part from an output from the indirect predistortion model; and feeding back the adjustment to the indirect predistortion model.

In accordance with another embodiment of the invention, the step of directly adjusting the predistortion data during a direct learning mode after convergence has been reached for the indirect learning mode by iteratively adjusting the predisortion data based at least in part on the output of the power amplifier model further comprises receiving the output from the power amplifier model by a gain circuit; providing an output from the gain circuit to a summing circuit; generating an adjustment for the predistortion data at least in part from an output from the gain circuit and at least in part from the input signal; and providing the adjustment to a direct predistortion model.

In accordance with another embodiment of the invention, the step of directly adjusting the predistortion data during a direct learning mode after convergence has been reached for indirect learning mode by iteratively adjusting the predisortion data based at least in part on the output of the power amplifier model further comprises calibrating a power amplifier model.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a circuit in accordance with an embodiment of the invention.

DETAILED DESCRIPTION

Refer now to the drawings wherein depicted elements are, for the sake of clarity, not necessarily shown to scale and wherein like or similar elements are designated by the same reference numeral through the several views.

Referring to FIG. 1 of the drawings, the reference numeral generally depicts a circuit that determines or calculates a pre-inverse of a nonlinear system. The circuit 100 is generally comprised of several portions: an indirect learning circuit 126; an amplifier circuit 128, and direct learning circuit 130.

The main portion of the circuit 100 is generally the amplifier circuit 128. The amplifier circuit 128 is generally comprised of a datapath 102 and a power amplifier 116. The datapath 102 receives an input signal x[n] and modifies the input signal x[n] using predistortion data contained within the datapath 102 to generate an output signal w[n]. Additionally, the datapath can include Digital-to-Analog Converters (DACs), mixers, filters, and other elements to convert signals between the base band and RF frequency while the DPD runs in the digital base band. This output signal w[n] is then amplified by the power amplifier 116 to generate an output y[n]. To arrive at a set of generally accurate predistortion data, indirect and direct learning modes (which can each operate on an iterative basis) can be employed.

During an indirect learning mode, the indirect learning circuit 126 is able to adjust the predistortion data of the datapath 102. The indirect learning circuit 126 is generally comprised of a gain circuit 124, an indirect predistortion model 106, and a summing circuit 112. In operation, the gain circuit 124 receives the output y[n] from the power amplifier 116 and normalizes the gain of the output y[n] of the power amplifier 116 to provide a normalized output z[n]. Output z[n] can then be provided to the indirect predistortion model 106. Preferably, the indirect predistortion model 106 is comprised of processing circuitry (such as a microprocessor and memory) with computer code for the indirect predistortion model embodied thereon. Summing circuit 112 receives the output ŵ[n] of the indirect predistortion model 106 and output w[n]. Summing circuit 112 can then feed back the difference between output ŵ[n] and w[n] or adjustment e1[n] to the indirect predistortion model 106, which can then update or adjust the predistortion data.

The process of providing adjustment or operation in an indirect learning mode occurs until convergence is reached, and operation in the indirect learning mode is generally considered an initialization process. With convergence, the output ŵ[n] and w[n] should be generally equal, and the output z[n] and input signal x[n] should be approximately equal to one another. However, convergence does not necessarily mean accurate. In particular, there is generally a difference between ŵ[n] and w[n], which can be attributed to a model error, and this "indirect learning" lacks theoretical completeness since it evaluates the post-inverse of a nonlinear system (i.e., power amplifier 114). But, if the indirect learning results provide good linearization performance, the solution (i.e., predistortion data) provided as a post-inverse should be in the vicinity of pre-inverse. Essentially, the predistortion data from indirect learning is "in the neighborhood" of an accurate predistortion model.

To further refine or "fine tune" the predistoriton data, the direct learning circuit 130 can then be employed. Preferably, once convergence is reached in the indirect learning mode, the predistortion data from the indirect predistortion model 106 is copied to the direct predistortion model 104. The direct predistortion model 104 receives the input signal x[n] and provides an output to multiplexer 108. Multiplexer 108 is then adapted to select between the output w[n] and the output from the direct predistortion model 104. The output of the multiplexer 108 is output to the power amplifier model 114, which is supposed to mimic the nonlinear behavior of the power amplifier 114. The output ŷ[n] of power amplifier model 114 is input into demultiplexer 118, which is coupled to the summing circuit 120 and gain circuit 122. The normalizer 122 is generally coupled to summing circuit 110. Additionally, each of the direct predistortion model 104 and the power amplifier model 114 can be comprised of processing circuitry (i.e., microprocessor and memory) with computer program code for the direct predistortion model or power amplifier model (respectively) embodied thereon.

In operation, the direct learning circuit 130 can operate generally in parallel to the amplifier circuit 128 in a pre-inverse configuration. During "fine tuning," the multiplexer 108 couples the direct predistortion model 104 to the power amplifier model 114, and the demultiplexer 118 couples the power amplifier model 114 to the gain circuit 122. This allows the direct predistoriton model 104 and power amplifier 114 to generate an output y[n], which is normalized by the gain circuit 122. The difference between the output of gain circuit 122 and input signal x[n] or adjustment e2[n] is determined by the summing circuit 110. The adjustment e2[n] can then be applied to the direct predistortion model 104. When the "fine tuned" predistoriton data is within a desired error or range, the predistoriton data can be transferred or copied to the datapath 102 to generally linearize the power amplifier 116. Additionally, both the indirect predistortion model 106 and the direct predistortion model 104 can be copied to the datapath during operation as often as desired.

Additionally, in this configuration, the power amplifier model 114 is preferably calibrated prior to the "fine tuning" of the direct learning circuit 130. To calibrate the power amplifier model 114, the multiplexer 108 selects output w[n] to be input into the power amplifier model 114, and the demultiplexer 118 selects the output ŷ[n] to be directed toward the summing circuit 120. In operation, the output w[n] is processed by the power amplifier 116 and the power amplifier model 114 substantially simultaneously. This difference between output ŷ[n] and y[n] or adjustment e3[n] is determined by the summing circuit 120 and fed back to the power amplifier model 114. This adjustment e3[n] allows the power amplifier data to be updated so that the power amplifier model 114 can generally mimic the behavior of the power amplifier 116.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an amplifier circuit including:
      a datapath that receives an input signal; and
      a power amplifier that is coupled to the datapath, wherein the power amplifier receives a first output from the datapath, and wherein the power amplifier provides a second output;
   an indirect learning circuit that is coupled to the amplifier circuit, wherein the indirect learning circuit iteratively adjusts predistortion data based at least in part on the first output and the second output during an indirect learning mode until convergence is reached; and
   a direct learning circuit that is coupled to the amplifier circuit and the indirect learning circuit and that receives the input signal, wherein the predistortion data is copied to the direct learning circuit from the indirect learning after convergence is reached, wherein the direct learning circuit adjusts the predistortion data during a direct learning mode, and wherein the direct learning circuit adjusts the operation of the datapath with the predistortion data.

2. The apparatus of claim 1, wherein the indirect learning circuit further comprises:
   a gain circuit that is coupled to the power amplifier and that receives the second output;
   an indirect predistortion model that is coupled to the gain circuit; and
   a summing circuit that is coupled to the datapath and the indirect predistortion model, wherein the summing circuit combines at least a portion of the first output with an output from the indirect predistortion model, and wherein the summing circuit feeds back its output to the indirect predistortion model to adjust the predistortion data during the indirect learning mode.

3. The apparatus of claim 2, wherein the indirect predistortion model further comprises processing circuitry with computer programming code for the indirect predistortion model embodied thereon.

4. The apparatus of claim 1, wherein the direct learning circuit further comprises:
   a direct predistortion model that is adapted to receive predistortion data from the indirect learning circuit and that receives the input signal, wherein the direct predistortion model is adapted to adjust the datapath;
   a power amplifier model that is adapted to receive a third output from the direct predistortion model;
   a gain circuit that is adapted to receive a fourth output from the power amplifier model; and
   a summing circuit that is coupled to the gain circuit and the direct predistortion model and that receives the input signal, wherein the summing circuit combines at least a portion of the input signal with at least a portion of a fifth output from the gain circuit, and wherein the summing circuit provides a sixth output to the direct predistortion model.

5. The apparatus of claim 4, wherein the direct predistortion model further comprises processing circuitry with computer programming code for the direct predistortion model embodied thereon.

6. The apparatus of claim 4, wherein the direct learning circuit further comprises:

a second summing circuit that receives an output from the power amplifier and that is adapted to receive the fourth output;

a multiplexer that is coupled between the direct predistortion model and the power amplifier model, wherein the multiplexer is adapted to receive the first output and the third output; and a demultiplexer that is coupled between the power amplifier model and the gain circuit, and wherein the demultiplexer is coupled between the power amplifier model and the second summing circuit.

7. A method for determining a pre-inverse of a nonlinear system, the method comprising:

indirectly adjusting predistortion data during an indirect learning mode until convergence is reached by iteratively:

providing an input signal to a datapath;

providing an output from the datapath to a power amplifier and to an indirect learning circuit; and adjusting the predistortion data based at least in part on the output from the datapath and at least in part based on an output from the power amplifier;

copying the predistortion data from the indirect learning circuit to a direct learning circuit; and directly adjusting the predistortion data during a direct learning mode after convergence has been reached by iteratively adjusting the predisortion data based at least in part on an output of a power amplifier model.

8. The method of claim 7, wherein the step of adjusting the predistortion data based at least in part on the output from the datapath and at least in part based on the output from the power amplifier further comprises:

receiving the output from the power amplifier by a gain circuit;

providing an output from the gain circuit to an indirect predistortion model;

generating an adjustment for the predistortion data at least in part from the output from the datapath and at least in part from an output from the indirect predistortion model; and feeding back the adjustment to the indirect predistortion model.

9. The method of claim 7, wherein the step of directly adjusting the predistortion data during a direct learning mode after convergence has been reached by iteratively adjusting the predisortion data based at least in part on the output of the power amplifier model further comprises:

receiving the output from the power amplifier model by a gain circuit;

providing an output from the gain circuit to a summing circuit;

generating an adjustment for the predistortion data at least in part from an output from the gain circuit and at least in part from the input signal; and providing the adjustment to a direct predistortion model.

10. The method of claim 9, wherein the step of directly adjusting the predistortion data during a direct learning mode after convergence has been reached by iteratively adjusting the predisortion data based at least in part on the output of the power amplifier model further comprises calibrating a power amplifier model.

* * * * *